United States Patent [19]

Lapeyre

[11] Patent Number: 5,003,503

[45] Date of Patent: Mar. 26, 1991

[54] COMPREHENSIVE COMPUTER DATA CONTROL ENTRIES FROM VERY FEW KEYS OPERABLE IN A FAST TOUCH TYPE MODE

[75] Inventor: James M. Lapeyre, New Orleans, La.

[73] Assignee: The Laitram Corporation, New Orleans, La.

[21] Appl. No.: 542,782

[22] Filed: Jun. 26, 1990

Related U.S. Application Data

[63] Continuation of Ser. No. 450,070, Dec. 13, 1989, abandoned, which is a continuation-in-part of Ser. No. 787,633, Oct. 15, 1985, abandoned, and a continuation-in-part of Ser. No. 395,216, Aug. 17, 1989, abandoned, which is a continuation of Ser. No. 844,875, Mar. 27, 1986, abandoned, which is a continuation-in-part of Ser. No. 729,559, May 2, 1985, abandoned.

[51] Int. Cl.$^5$ .................................................. G06F 3/16
[52] U.S. Cl. ............................ 364/710.12; 364/709.16
[58] Field of Search ........................ 364/710.12, 709.16

[56] References Cited

U.S. PATENT DOCUMENTS

| 3,967,273 | 6/1976 | Knowlton | 364/709.16 |
| 4,185,170 | 1/1980 | Morino et al. | 364/710.12 |
| 4,249,245 | 2/1981 | Nakanishi et al. | 364/710.12 |
| 4,282,404 | 8/1981 | Tanimoto et al. | 364/710.12 |
| 4,336,598 | 6/1982 | Yanagawa | 364/710.12 |
| 4,412,210 | 10/1983 | Washizuka et al. | 364/710.12 |

OTHER PUBLICATIONS

Claver et al., "Computer-Assisted Word Entry Process", IBM Tech. Disclosure Bulletin, vol. 21, No. 10, Mar. 1979, p. 4184.

Primary Examiner—David H. Malzahn
Attorney, Agent, or Firm—Laurence R. Brown

[57] ABSTRACT

A data processing keyboard system is provided wherein data and command signals from the keyboard are entered by two or more successive keystrokes. This makes available from the comprehensive capability of present day computers large numbers of keyboard accessible commands. Also surprisingly then this invention can replace a normal QWERTY typewriter keyboard with most of its functions by a set of only seven or twelve keys. Thereby alphabetic characters, decimal digits and a store of computer command entries may be processed with each entry requiring two or more strokes of the computer keyboard keys. Functional commands such as spacing, return or shift can be intermixed with the choice of data characters. Means for shifting from a single-stroke-per-entry computation mode to a two-stroke-per-entry alpha mode of computer operation may be provided. Keyboard selected modes change the key assignments. Thus an alpha mode for a computer may assign the entire alphabet first stroke to a set of three home keys arranged in a geometric configuration of no more than nine keys for touch typing control by fingers on one hand. The key assignments are made wherein the easier to access strokes are allocated to the more frequently encountered letters of the alphabet. To assure synchronization of keystroke sequences produced by an operator with internal computer entries, an audible operator timing signal such as a beep is produced, preferably for each space between words.

6 Claims, 2 Drawing Sheets

Fig. 3

COMPREHENSIVE COMPUTER DATA CONTROL ENTRIES FROM VERY FEW KEYS OPERABLE IN A FAST TOUCH TYPE MODE

This application is a continuation of application Ser. No. 07/450,070, filled Dec. 13, 1989 now abandoned which is a continuation-in-part of my copending application of the same title, U.S. Ser. No. 07/395,216, filed Aug. 17, 1989 abandoned, which in turn is a continuation of U.S. Ser. No. 06/844,875, filed Mar. 27, 1986 now abandoned which is a continuation-in-part of my copending application U.S. Ser. No. 06/729,559, filed May 2, 1985 for Programmable Computer with Alphanumeric Capabilities Having Few Keyboard Keys, now abandoned in favor of U.S. Ser. No. 07/331,049, filed Mar. 29, 1989. Said Ser. No. 450,070 is further a continuation-in-part of my copending application U.S. Ser. No. 06/787,633, filed Oct. 15, 1985, now abandoned, for Computer Keyboard System With Few Keys Displaying Hundreds of Functions, and incorporates the foregoing parent cases herein in entirety by reference.

TECHNICAL FIELD

This invention relates to entry of many data and control function commands into comuputerized data processing systems from very few keys on a keyboard, and more particularly it relates to computer-keyboard systems operable to make manual data and command input entries in response to two or more successive keystrokes.

BACKGROUND ART

In the rapid development of the computer arts, the capacities of the computer to handle data has greatly increased. However the manual input of data through keyboards has continued to be a significant limitation to the high speed data processing capabilities available. Also there are so many possible functions performed by modern computers, that there is a limitation on the use of many of them in the keyboard manual input restrictions of the prior art. Even pocket sized portable computers have hundreds of data and command functions otherwise accessible to keyboard operation unavailable because of keyboard limitations.

The trend to computer keyboard operation is evidenced by the C. Tung, U.S. Pat. No. 3,892,958 July 1, 1975, which requires 36 keyboard keys to access at most about 100 computer functions, thereby using only a small part of those that could be made available. This keyboard uses two of the 36 keys for changing the key assignments from a default mode to two other modes thereby tripling the number of accessible data input characters and operating commands otherwise available from the 36 keys. Each key thus produces from a single keystroke a different function in each of the modes. Thus to increase the number of functions above about 100 in this conventional prior art manner, either the number of keys must be increased or the number of key assignment modes must be increased.

It is extremely difficult to enter any substantial variety of information into the computer, with such keyboards, including the provision of alphabetic characters, which with 26 entries required necessitates separate modes for numeric digits or computer command signals and alpha characters from the 36 key keyboard. Futhermore, if this computer is used in the programming mode for example, very complex keystroke sequences are involved, such as changing from mode to mode by use of the mode change keys many times in the entry of a program step. This of itself is not conducive to fast entry touch typing. Furthermore the key layout is not capable of easy entry by touch typing, and is primarily only useful for slow hunt and peck methods.

In other conventional computer input keyboards such as for personal computers, QWERTY typewriter keyboards are supplemented with further sets of keys, typically about 40. It is impossible to efficiently use such keyboards for rapid touch typing input because of the necessity to reach to many inconvenient positions for command signals. Also it is conventional for each command signal to use one key, so that most of the available capacity of the computer to access functions and subroutines simply is sacrificed in favor of complex routines using many keystrokes and much waiting time.

It is therefore a primary object of this invention to produce rapid manual entry of input data and commands into a data processing computer system from a keyboard, capable of rapid touch typing and having the capability to process a greater proportion of the accessible computer functions with simple keystrokes.

It is known in the art to reduce the number of keyboard keys required for a given number of entries, by making entries of individual data characters or control commands in response to two successive keystrokes. Thus, a set of keys may produce more than one input entry per key. If n keys are available, n times n entries may be provided by two strokes per character operation, n times n times n entries may be provided by three stroke per character operation, etc.

Thus in British Patent No. 1,417,849, Dec. 17, 1975 with two strokes per character, operation of a typewriter is permitted by means of only seven keys. U.S. Pat. No. 3,833,765 issued to E. hillborn et al. Sept. 3, 1974 provides for both alphabet characters and more complex messages to be chosen by the two letter codes provided by the two successive keystrokes from a set of twelve keys arranged for four finger touch typing with one hand. U.S. Pat. No. 3,967,273 issued to K. Knowlton on June 29, 1976 provides for the two keystroke per character entry operation from a telephone keyboard to permit both alphabetic and numeric digits to be generated from twelve keys.

It is one feature of the invention that this type of two (or more) strokes per character keyboard in data processing systems will reduce the number of keys required and significantly increase the number of computer functions accessible by the keyboard. Thus, with only twelve keys, more selections may be made in a two stroke per character mode than with the 36 keys of the aforementioned Tung keyboard.

No known computer-keyboard art has been provided that is convenient and fast for manual manipulation in the touch typing mode for both data and command input entries, or for large numbers of entries with few keys. Thus, it is a particular system objective to provide a touch typing keyborad input capability with a few keys efficiently operable by the fingers of a single hand or entry of a large number of both data and command signals to a computerized data processing system.

Also it is an object of this invention to provide improved keyboards having few keys and operable in fast typing modes from touch typing from the fingers of one hand for replacing conventional typewriter keyboards.

It has been found in computer keyboards requiring two or more successive keystrokes per entry adapted for high speed touch typing that typing speeds can approximate those customary in conventional typewriters after operators learn the alphabet and practice the two stroke per entry mode of operation.

However a problem is introduced with the two (or more) stroke per entry mode of operation that could result in unintelligible text following an operator error. Thus, if one stroke of a two-stroke sequence is missed by the operator in a typing sequence without the operator's recognition and correction, the following text will become unintelligible, because the operator continues to stroke in a two stroke per entry mode with the two strokes out of synchronization with the entry of the data into the computer.

Accordingly an explicit objective of this invention is to produce a solution to that problem.

DISCLOSURE OF THE INVENTION

The invention is embodied in a computer-keyboard system having a set of keys operably by the fingers of a single hand in a touch typing mode at efficient data and command entry speeds for entry of many input signals to make comprehensive use of the large number of commands available from present day computerized data processing systems or to replace conventional typewriter keyboards.

Of particular importance in this invention is the key-character layout, which significantly affects typing speed. Thus, for example in one preferred embodiment, all the alphabet characters are selectable from three home keys to be operated by the three middle fingers of one hand for a first stroke. Thus, where more than three keys are employed, no more than one reach to an adjacent key is required for any alphabetic character. Further, the more frequently used letters are assigned the easiest fingerstroke positions, thereby further optimizing the typing speed so that even with two strokes required per entry typing input speeds comparable to high speed typing on standard QWERTY keyboards is feasible. In this manner many more selections than the alphabet are obtained from very few keys, providing for control of both computer input data and command entries by the touch typing mode for the first time.

When the keyboard data and command entries are made in response to a sequence of two successive keystrokes, thereby as many as n times n entries are available from n keyboard keys. Thus seven keys provide 49 entries in each key allocation mode, twelve keys 144, etc. The keys are particularly arranged for efficent touch typing input, by allocation of the most frequently used alphabet characters to the easiest to stroke key pair location. By providing for a plurality of key allocation modes, the number of key entry selections is further increased. Thus, in an alphabetic mode of operation the entire alphabet may be selected by a first keystroke from only three keys at a home key position with the remaining keystrokes allocated to adjacent keys that are easy to reach. With three keystrokes per entry, all entries are made from the home keys. That means the time taken to move fingers, or reach, is eliminated from the touch typing process and significantly increases the typing speed.

In order to make it convenient and assured that the operator is typing in synchronism with computer entries in a two (or more) stroke per entry mode of keyboard operation, a special synchronization signal is generated by the computer such as a beep or click. Thus, the operator immediately becomes aware of any typographic errors that cause the two typing strokes for selected entries chosen by the operator to be out of synchronization with the computer entries.

BRIEF DESCRIPTION OF THE DRAWINGS

The invention may be better understood by reference to the accompanying drawings, in which:

FIG. 3 is a plan view of a twelve key keyboard key array and key selection chart, which permits efficient and rapid touch typing entry of the entire alphabet with three fingers of a single hand.

THE PREFERRED EMBODIMENTS

Figures 1, 2:
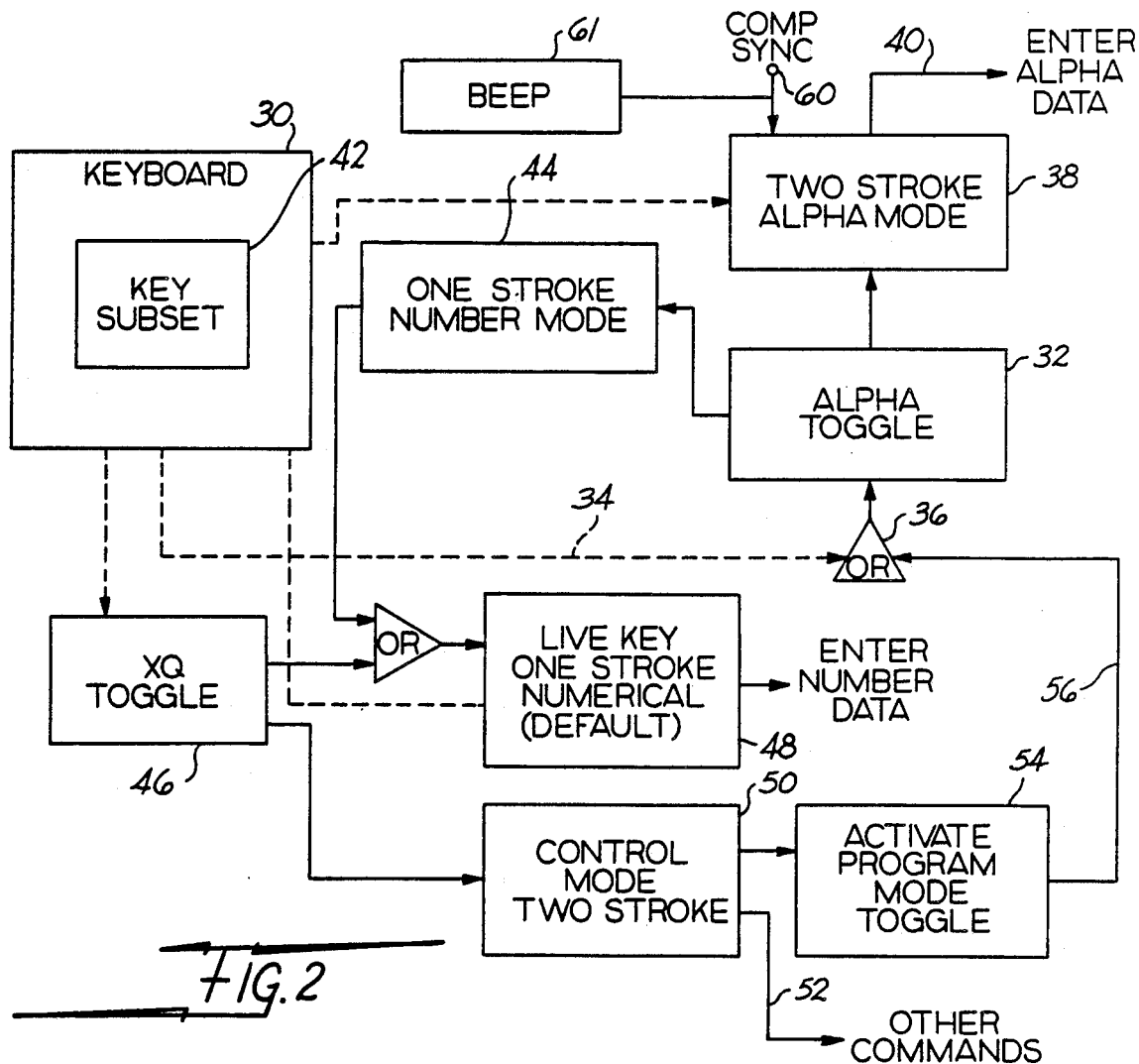
FIG. 1 is a plan view layout of a seven key keyborad array for producing up to forty-nine unique signal selections, as laid out for alphanumeric operation to replace the standard typewriter keyboard of over forty keys.
FIG. 2 is a block diagram of computer control means afforded in a preferred embodiment of their invention.

In FIG. 1, a keyboard arrangement is shown wherein seven keys are identified by decimal digits 0 to 7. In this embodiment with two strokes per character selection, 49 choices are available, and the shift key provide an alternative 49 choices. The legend on the respective keys, laid out in a rectangular geometric configuration in this embodiment, thus is simply the available character or function description and a subscript. Thus the key displaying the desired character selection is first stroked, and then the key designated by the subscript. For the shift function, then an 0—0 sequence is stroked, etc. Note that the vowels A, E, I, most frequently encountered are entered with the simplest strokes 1—1, 2—2, 3—3. The control functions such as space and return are similar more frequently encountered selections. This array can be operated by four fingers on one hand or three if the shift key is a reach key. Thus it is particularly adaptable to fast touch type operation in the manner that will be more thoroughly discussed hereinafter. Fast typing is available with a rhythm requiring exactly two strokes for any selection.

Figure 3:
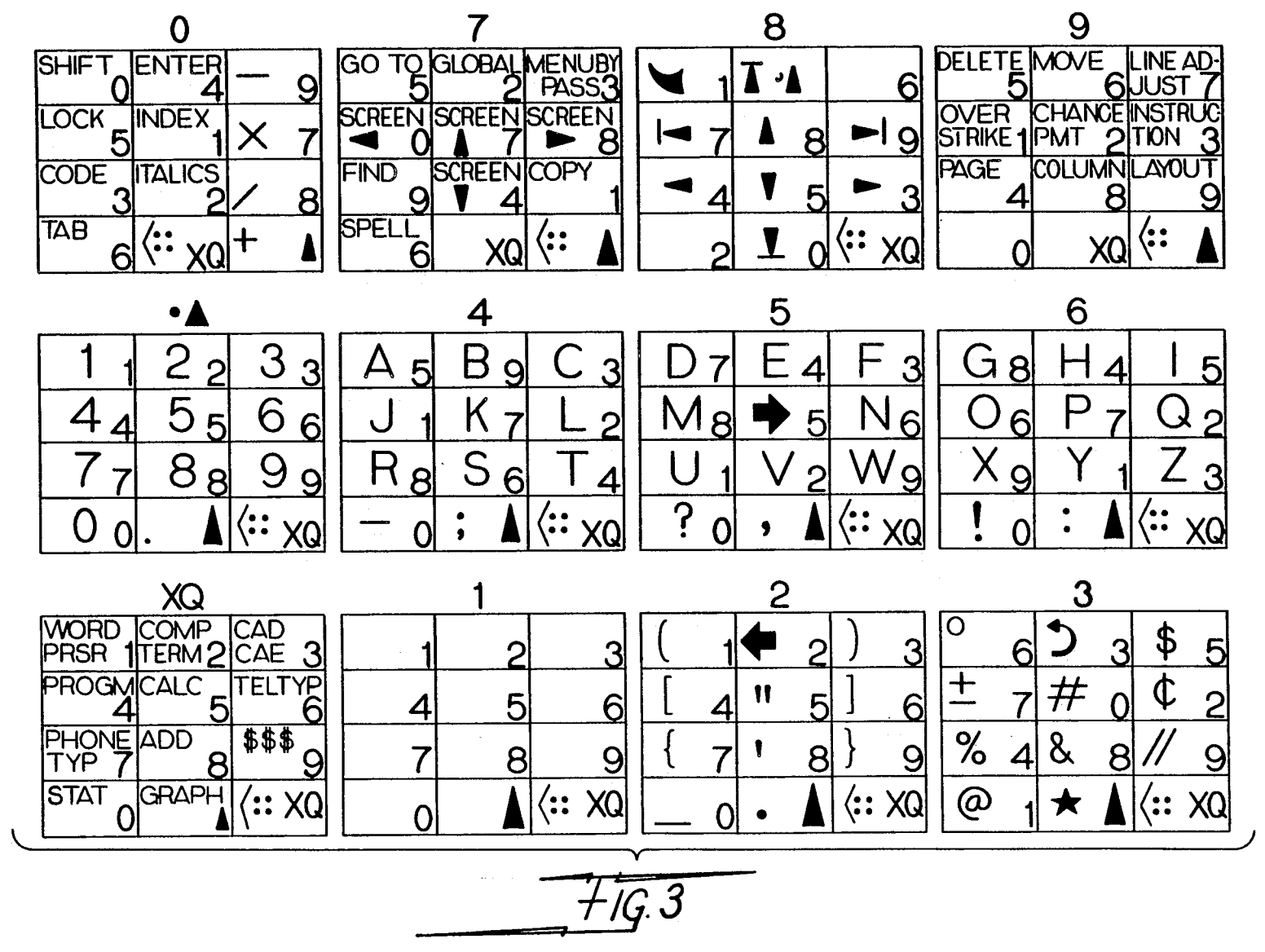

The parent applications, above referred to and incorporated herein by reference, similarly set forth computer systems which operate to input data characters and command signals from a keyboard in response to two successive mutually exclusive strokes of single ones of the keys with a few keys providing many input selections laid out adjacent the keyboard on an operating chart, such as that of FIG. 3. This keyboard provides twelve basic keys, identified by keyboard legends 0-9, XQ, and a decimal point-entry arrow.

The associated computer is able to execute the various commands outlined in the keyboard chart by means of accessible command signals or stored program subroutines, and has keystroke decoding means for selecting the desired data or command inputs from the designated keystrokes as shown in the block diagram system of FIG. 2.

The XQ key 12 of FIG. 3 is a control or mode shift key usable to activate from a single sroke default mode the two stroke alpha mode, for example with keystrokes sequence XQ, 1. In this alpha mode, note that the roles of the keys on the keyboard are identified in the accompanying charts positioned on the keys. Note that entire 26 alphabet characters are selected by a first keystroke from key row 4,5,6, which is a home key row for one hand touch typing. A set of nine keys can give 9×9 or 81 selections in the alpha mode, and a representative set of available characters and commands are set forth on the chart. Decimal digits are also chosen by two strokes starting with the decimal point key to make this an alphanumeric mode.

The computer-keyboard system functional block diagram organization for instituting the various features herein described is shown in FIG. 2.

Computer input speed is keyboard limited in the manual to machine conversion made by way of the keyboard. Thus it is a critical problem in a computer-keyboard system to provide for as fast a manual keyboard input speed as feasible. Also it is critical in many operations to have one hand free for other purposes, so that a single hand operable keyboard is desirable.

Prior art keyboard input systems for alphabetic input has overwhelmingly been the conventional two hand QWERTY type. It is however known in the art to improve the ease of manual alphabetic information input by using frequency of use tables for different alpha characters and assigning the most frequently used characters to the easiest to use key combinations. British Patent Specification No. 511,240 Aug. 15, 1939 selects key chord combinations of more than one key simultaneously actuated to select more frequently used alphabet letters with relatively easy to finger chord combinations. Thus for a stenotype machine requiring two hands, the keys are grouped in a coded manner that permits chord selections by up to four fingers on either hand plus the two thumbs in the easiest and therefore the fastest manner for the most frequently encountered alpha characters. This principal is now extended by this invention to an entirely different kind of key entry system, namely a one handed touch typing system using only three fingers on one hand for selection, wherein each entry requires two successive strokes of a single key in either keyboard embodiment FIG. 1 or 3.

In this mode of operation, best illustrated by the twelve key embodiment of FIG. 3, wherein the entire alphabet is processed by an initial keystroke on three keys 4, 5, 6, with three middle fingers of one hand, the following chart outlines the keying difficulty factor, wherein it is a goal to obtain with the least difficult three categories in the order of over 90% of the more frequently used characters. These difficulty charts may be empirically derived from various touch typists using the explicit key combinations and fingers to which this invention is directed. In the following table, the keys identified by the numerical digit layout thus account for the reach factor of the different ones of the three middle fingers on one hand when they are positioned at the 4-5-6 home key row.

| RELATIVE EASE OF SUCCESSIVE KEYSTROKE PAIRS OF SINGLE KEYS | |
| --- | --- |
| Easiest | 4-4, 5-5, 6-6 |
| Very easy | 4-5, 5-1, 5-4, 5-7, 6-1, 6-4, 6-5 |
| Easy | 4-2, 4-6, 4-8, 5-3, 5-6, 6-2, 6-7, 6-8 |
| Harder | 4-3, 4-9, 5-9 |
| Hardest | 4-1, 4-7, 5-2, 5-8, 6-3, 6-9 |

From various tables available showing the relative frequency of use of the alphabet characters per thousand characters, the following from Britannica is representative, and the starred entries are those selected for entry without moving the three stroking fingers away from the set of the three home keys 4, 5, 6,:

| FREQUENCY OF OCCURRENCE OF ALPHABET CHARACTERS | | | | |
| --- | --- | --- | --- | --- |
| *E 130 | *I 74 | C 31 | Y 19 | X 5 |
| *T 92 | S 61 | F 28 | G 16 | Q 3 |
| *N 79 | D 42 | P 27 | W 16 | K 3 |
| *R 76 | L 36 | U 26 | V 15 | J 2 |
| *O 75 | *H 34 | M 25 | B 10 | Z 1 |
| *A 74 | | | | |

A preferred embodiment of the keyboard afforded by this invention for fast data entry with a keyboard requiring two successive strokes of single keys with three fingers resting at the 4, 5, 6, home position is set forth in FIG. 3.

Note that this provides an important feature of the invention, particularly and peculiarly directed to two stroke per entry type keyboard system. For the entire alphabet, the first stroke is at the home key position and does not require any movement of the typing finger to another key. That provides the fastest possible mode of entry. Furthermore, the entire alphabet is selected from three rows of keys, labelled with the decimal digits 1 to 9, so that the second stroke in the worst case requires only movement of a stroking finger to an adjacent key.

Furthermore in accordance with the foregoing charts, those alphabetic characters most frequently encountered are chosen by the easiest to enter keystroke sequences. Thus for the characters T, O and the space function, the fingers need not move from the home keys, nor do they have to more other than to provide two successive strokes of the same key, 4, 4 or 5, 5 or 6, 6. Other frequently encountered characters have very easy to use finger sequences, such as E processed by the two keystrokes 5, 4. It is a particular advantage to limit the typing strokes to the three middle fingers, since the thumb and little finger tend to be more awkward and take more typing time in reaching away from home keys. Note that 80% of business usage is covered by the characters E, T, A, O, I, N, S, H, R, D, L, U and space, which in the FIG. 3 embodiment are all obtained with the easiest strokes and most from the home key bank 4, 5, 6.

Now consider the typing of the word—faster—in the FIG. 3 keyboard embodiment. The stroking sequence is 5-3; 4-5; 4-6; 4-4; 5-4; 4-8. However if the first stroke 5 were missed by a typographic operator error the computor in the two stroke per entry mode would see 3-4; 5-4; 6-4; 4-5; 4-4; 8. That would enter the undesired or intelligible data: % E H A T plus the half entry 8. Accordingly this invention proposes to resolve the possibility of any such malperformance because the operator and computer two-stroke-per-entry system are out of synchronization.

In this respect the operating system of FIG. 2 is now briefly explained. The key actuation function flow lines from the keyboard 30 are shown in dotted line form. Pertinent control function interactions are shown in full line form.

The novel feature afforded by this invention of unexpectedly greater keyboard capacity with a few keys, such as twelve, for selection of a great number of command functions and all the alphabetic character selections usually performed on a full keyboard typewriter of over 50 keys is achieved by this system, in the manner hereinbefore described in connection with the keyboard of FIG. 3.

Additional computer operation features may be provided in the alphabetic mode of operation, including the capacity to rapidly enter alphabetic information in a program mode for writing program steps. Thus, the alphabetic mode toggle 32 (FIG. 2) is actuated by the alpha command initiated by the two stroke sequence of the XQ key and the one (1) key in the command selection two stroke control mode of FIG. 3, as represented along key actuation flow line 34, through OR circuit 36. This selects the alpha mode 38 where alphabetic data output characters are generated at 40 in response to two key strokes from the subset 42 of keys as hereinbefore described. The toggle 32 may convert the mode to a live key single stroke number entry default mode 44 by further actuation of alpha toggle 32 from the keyboard 30 along line 34. Thus, alphanumeric entry from a few keys is feasible without relinquishing the desirable fast entry of numerical data with one stroke per entry live keyboard operation.

In addition to the subset of keys 42, there is an XQ toggle 46 which upon receiving a two stroke sequence XQ XQ operates toggle 46 to convert from the default condition of live key single stroke numerical entry mode 48 to the control mode 50 providing a set of commands such as 52 including the program mode activation toggle 54. By means of lead 56 and OR circuit 36 the alpha toggle 32 is activated to operate in the program mode for selection of either the default numeric live keyboard mode via 44 or the two stroke alphabetic entry mode via 38. Thus, the program steps may be quickly entered including any of the alphabetic characters with a minimum of command control function operations and with a minimum of keys, far fewer than conventionally needed on prior state of the art calculators capable of handling the full alphabet set of 26 characters.

In order to resolve the operation synchronization problem heretofore described, a computer synchronization signal 60 produced in timed relationship with entries (40) in the two-stroke alpha mode produces a beep 61 or other operator awareness synchronization signal. Accordingly the operator is made aware of any typographic errors that cause a departure in typing rhythm from the synchronous entries of alpha characters (40).

Preferably this synchronization beep is produced at the end of each word by selection of spaces between words. Although this may result in entry of one garbled word without notice that can usually be corrected at that time. More frequently encountered character entry signals, such as those for every two stroke sequence, would resolve the problem, but could cause the operator to become so accustomed to the beeps that their function is not timely recognized.

In this respect the 0–4 entry or space code of FIG. 3 may both enter the word with the space function and produce the beep (61).

This invention therefore has provided keyboards with fewer keys than heretofore contemplated for typing and computer systems, and has provided improvements in the entry efficiency and convenience of using keyboards, particularly for rapid one hand touch typing entry of many different input characters or instructions from few keys. Therefore, having advanced the state of the art, those novel features representative of the spirit and nature of the invention are defined with particularity in the following claims.

I claim:

1. The method of informing keyboard operators during manual input of sequences of keystrokes representing computer entries into a computer operating in a multiple stroke sequence per entry mode the relationship of the manual input with synchronous timing of computer entries for multiple stroke sequences within the computer comprising the steps of providing a computer synchronization signal in timed relationship to each said sequence of keystrokes, and producing an audible timing signal in response to the computer synchronziation signal to signify the timing relationship between the manual input of said multiple stroke keystroke sequences with computer timed entries from multiple stroke keystrokes sequences when the computer is operating in the multiple stroke per entry mode.

2. The method of claim 1 wherein the step of producing the audible timing signal selectively provides the audible signal only for entries of words in response to said computer synchronization signals for timing the entry of spaces between words.

3. Apparatus for informing a keyboard operator during manual input of keystrokes for producing computer entries in a computer operating in a multiple stroke per entry mode the timing relationship of multiple stroke keystrokes entries with synchronuous internal timing within the computer for processing data entries produced from a multiple stroke sequence of keystrokes comprising:

audible signal producing means, computer synchronizing means for producing a computer synchronization signal for a designated multiple sequence of strokes timed with a corresponding comupter entry, and means for producing audible signals from the audible signal producing means in response to said synchronization signal for informing the operator of the relationship between said manual input of keystrokes and computer processing of said multiple keystroke entries.

4. Apparatus as defined in claim 3 further comprising means for producing said synchronization signal only in response to multiple stroke input sequences for defining spaces between words.

5. An alpha data processing system adapted for high speed touch type input from a keyboard having a set of keys coupled to the system for manual input and processing of alphabetic characters in a two keystroke per entry mode, comprising in combination, means for audibly producing an audible timing signal, means for entering two stroke sequences into the computer, computer synchronization means for generating a timing signal in response to a single keystroke of a two stroke sequence to be entered, means for signalling to the operator with the audible timing signal a time synchronized with said timing signal for permitting an operator to time manual two stroke sequence entries with internal processing of corresponding alphabetic characters in the data processing system.

6. The system defined in claim 5 wherein said keyboard and data processing system is configured to provide a full set of alphabetic characters from a set of no more than twelve keys arranged so that a first of the two keystrokes for an entry of an alphabetic character in the two keystrokes per entry mode is made from a home key set of three keys.

* * * * *